(12) United States Patent
Tsukahara et al.

(10) Patent No.: US 11,043,625 B2
(45) Date of Patent: Jun. 22, 2021

(54) PIEZOELECTRIC DEVICE, MEMS DEVICE, LIQUID EJECTING HEAD, AND LIQUID EJECTING APPARATUS

(71) Applicant: SEIKO EPSON CORPORATION, Tokyo (JP)

(72) Inventors: Katsutomo Tsukahara, Shiojiri (JP); Eiju Hirai, Azumino (JP); Motoki Takabe, Shiojiri (JP); Daisuke Yamada, Shiojiri (JP); Yasuyuki Matsumoto, Azumino (JP); Shuichi Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 574 days.

(21) Appl. No.: 15/925,503

(22) Filed: Mar. 19, 2018

(65) Prior Publication Data

US 2018/0277736 A1 Sep. 27, 2018

(30) Foreign Application Priority Data

Mar. 27, 2017 (JP) .............................. JP2017-060593

(51) Int. Cl.
*H01L 41/047* (2006.01)
*H01L 41/053* (2006.01)
(Continued)

(52) U.S. Cl.
CPC ........ *H01L 41/047* (2013.01); *B41J 2/14233* (2013.01); *B41J 2/14274* (2013.01);
(Continued)

(58) Field of Classification Search
CPC .. H01L 41/047; H01L 41/053; H01L 41/0533
See application file for complete search history.

(56) References Cited

U.S. PATENT DOCUMENTS

| 8,297,742 B2 | 10/2012 | Von Essen et al. |
| 10,081,161 B2 | 9/2018 | Yoshiike et al. |

(Continued)

FOREIGN PATENT DOCUMENTS

| EP | 3213921 | 9/2017 |
| JP | 2007074892 | 3/2007 |

(Continued)

OTHER PUBLICATIONS

European Search Report issued in EP 18162070 dated Aug. 31, 2018.

*Primary Examiner* — Derek J Rosenau
(74) *Attorney, Agent, or Firm* — Workman Nydegger

(57) ABSTRACT

A piezoelectric device (an actuator unit) includes the following: a first substrate (a pressure chamber forming substrate, a diaphragm) having a piezoelectric layer and a first wiring conductor (a top electrode layer) that is at least partially stacked on the piezoelectric layer; and a second substrate (a sealing substrate) having a second wiring conductor (a bottom wiring conductor) that faces and is separated from the first wiring conductor (a top electrode layer) and to which an electrical signal different from an electrical signal that is applied to the first wiring conductor (a top electrode layer) is applied. At least one of the first wiring conductor (a top electrode layer) and the second wiring conductor (a bottom wiring conductor) is at least partially covered with an electrically insulating protective layer.

20 Claims, 4 Drawing Sheets

(51) Int. Cl.
  *B41J 2/14* (2006.01)
  *H02N 2/00* (2006.01)
(52) U.S. Cl.
  CPC ....... *H01L 41/0533* (2013.01); *H02N 2/0085* (2013.01); *B41J 2002/14491* (2013.01)

(56) References Cited

U.S. PATENT DOCUMENTS

| | | | |
|---|---|---|---|
| 10,150,294 B2 | 12/2018 | Hirai et al. | |
| 2011/0193916 A1* | 8/2011 | Hirai | H01L 41/0475 347/71 |
| 2011/0226807 A1 | 9/2011 | Von Essen et al. | |
| 2012/0168792 A1 | 7/2012 | Kang et al. | |
| 2012/0212547 A1 | 8/2012 | Takemoto et al. | |
| 2013/0033153 A1* | 2/2013 | Mizusawa | H03H 9/171 310/348 |
| 2013/0062996 A1* | 3/2013 | Udayakumar | H01L 41/318 310/321 |
| 2013/0084199 A1* | 4/2013 | Tanaka | H01L 41/0973 417/413.2 |
| 2014/0267504 A1* | 9/2014 | Ohashi | B41J 2/14233 347/68 |
| 2015/0029270 A1 | 1/2015 | Takemoto et al. | |
| 2016/0257093 A1 | 9/2016 | Yoshiike et al. | |
| 2017/0066239 A1 | 3/2017 | Hirai et al. | |
| 2018/0022095 A1 | 1/2018 | Hirai et al. | |

FOREIGN PATENT DOCUMENTS

| | | |
|---|---|---|
| JP | 2009107264 | 5/2009 |
| JP | 2011-194889 | 10/2011 |
| JP | 2012-171149 A | 9/2012 |
| JP | 2013095088 | 5/2013 |
| JP | 2013-247216 | 12/2013 |
| JP | 2016-147442 | 8/2016 |
| JP | 2016-162999 | 9/2016 |
| JP | 2016-185600 | 10/2016 |
| JP | 2017-052134 | 3/2017 |
| WO | 2016157832 | 10/2016 |

* cited by examiner

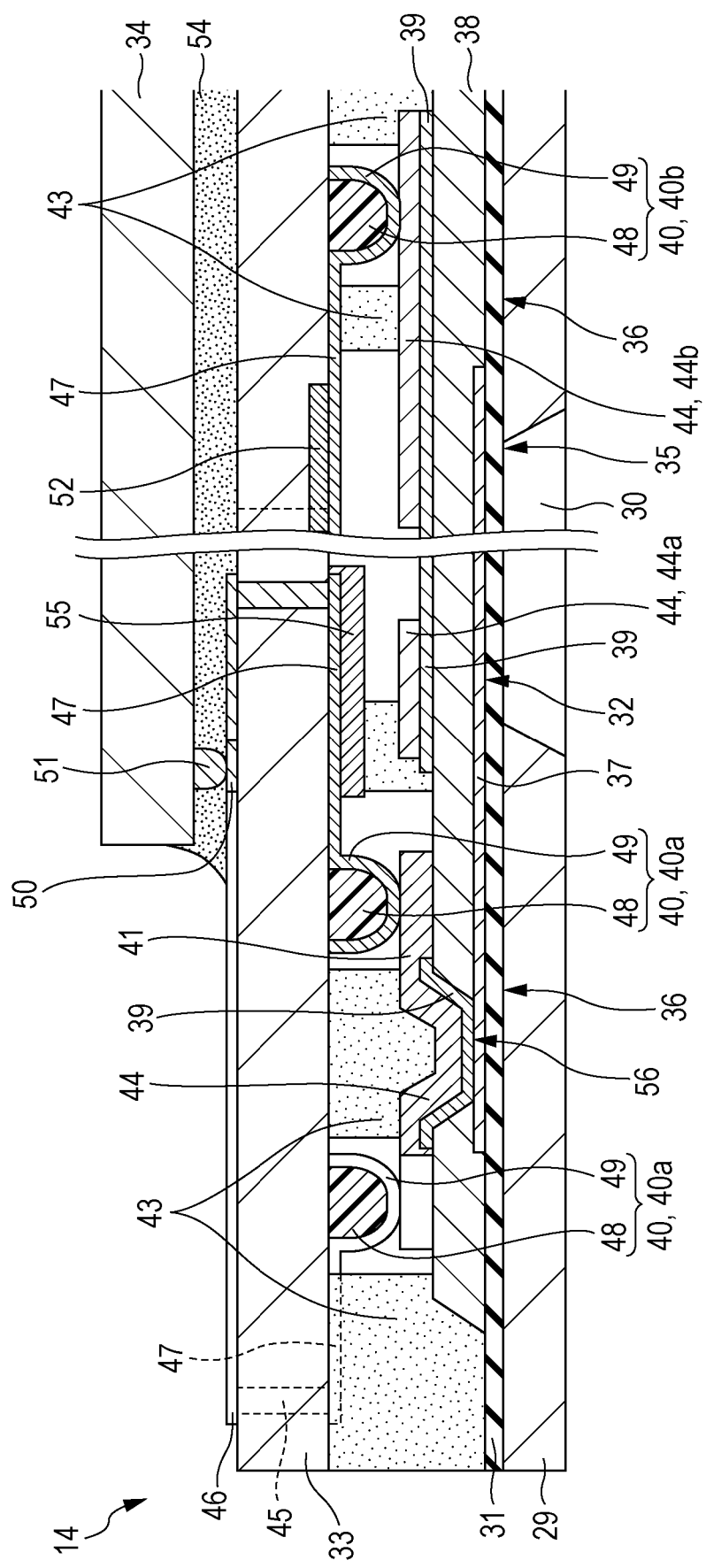

PIEZOELECTRIC DEVICE, MEMS DEVICE, LIQUID EJECTING HEAD, AND LIQUID EJECTING APPARATUS

The entire disclosure of Japanese Patent Application No. 2017-060593, filed Mar. 27, 2017 is expressly incorporated by reference herein.

BACKGROUND

1. Technical Field

The present invention relates to a piezoelectric device, a MEMS device, a liquid ejecting head, and a liquid ejecting apparatus, each including a first substrate having a first wiring conductor, and a second substrate having a second wiring conductor that faces the first wiring conductor.

2. Related Art

Micro-electro-mechanical systems (MEMS) devices that include a piezoelectric device with a piezoelectric element are used in various types of apparatuses. For example, liquid ejecting heads, which are a type of MEMS device, deform a piezoelectric element to generate a change in pressure of liquid in a pressure chamber in accordance with the deformation, thereby ejecting (discharging) droplets of ink from nozzles. Such liquid ejecting heads are used in liquid ejecting apparatuses including image recording apparatuses, such as ink jet printers and ink jet plotters, and various types of manufacturing apparatuses. For example, such liquid ejecting heads are used in the following apparatuses: display manufacturing apparatuses that manufacture color filters for displays such as liquid-crystal displays; electrode-forming apparatuses that form electrodes for displays such as organic electroluminescence (EL) displays and field emission displays (FEDs); and chip manufacturing apparatuses that manufacture biochips (biochemical elements). Specifically, recording heads used in image recording apparatuses eject liquid ink. Coloring material ejecting heads used in display manufacturing apparatuses eject red (R), green (G), and blue (B) coloring material solutions. Electrode material ejecting heads used in electrode-forming apparatuses eject a liquid electrode material. Bio-organic material ejecting heads used in chip manufacturing apparatuses eject a bio-organic material solution.

In some liquid ejecting heads, such as those disclosed in JP-A-2012-171149, a piezoelectric element and a wiring conductor (e.g., an individual electrode) that is drawn from the piezoelectric element are formed on a first substrate (e.g., a liquid chamber substrate), and the wiring conductor of the first substrate is connected to a terminal of a second substrate (e.g., a driving element) that is disposed to be separate from the first substrate. Further, these days it is common to form various wiring conductors on a surface of the second substrate that faces the first substrate.

In such a structure, a wiring conductor of a first substrate may face a wiring conductor of a second substrate, and different signals may be applied to the wiring conductors. If the wiring conductors of the first and second substrates are exposed to each other, such as is disclosed in JP-A-2012-171149, an electrical discharge may occur between the wiring conductors, causing a short-circuit between the wiring conductors. One approach to reduce the possibility of a short-circuit between the wiring conductors that face each other may be to increase the separation distance between the first substrate and the second substrate. However, this approach increases the size of liquid ejecting heads. Another approach may be to lay out wiring conductors of the first and second substrates such that the wiring conductors do not face each other. However, this approach limits design flexibility, thus possibly causing an increase in the size of liquid ejecting heads.

SUMMARY

An advantage of some aspects of the invention is that a piezoelectric device, a MEMS device, a liquid ejecting head, and a liquid ejecting apparatus for curbing an increase in size while reducing the possibility of a short-circuit between wiring conductors that face each other are provided.

A first aspect of the invention provides a piezoelectric device including the following: a first substrate having a piezoelectric layer and a first wiring conductor that is at least partially stacked on the piezoelectric layer and; a second substrate having a second wiring conductor that faces the first wiring conductor and to which an electrical signal different from an electrical signal that is applied to the first wiring conductor is applied, in which at least one of the first wiring conductor and the second wiring conductor is at least partially covered with an electrically insulating protective layer.

According to this aspect, the protective layer reduces the possibility of a short-circuit between the first wiring conductor and the second wiring conductor. Specifically, the protective layer serves as an energy barrier against the flow of electrons, thus reducing the possibility of an electric discharge between the first wiring conductor and the second wiring conductor. As such, the protective layer allows a reduction in the separation distance between the first wiring conductor and the second wiring conductor. Further, since the first wiring conductor and the second wiring conductor face each other, design flexibility is increased. This curbs an increase in the size of the piezoelectric device. Moreover, since the possibility of a short-circuit between the first wiring conductor and the second wiring conductor is reduced, the reliability of the piezoelectric device is increased accordingly.

The protective layer may be preferably made of an oxide, a nitride, or a resin.

This structure relatively facilitates forming the protective layer.

It may be preferable that the first substrate and the second substrate be joined together by an adhesive, and that the adhesive and the protective layer be made of an identical type of resin.

This structure allows the adhesive to be more tightly adhered to the protective layer, thus increasing the strength of adhesion (the strength of a joint) between the first substrate and the second substrate.

Preferably, application of a voltage to at least one of the first wiring conductor and the second wiring conductor may cause a maximum potential difference of ten volts (V) or more between the first wiring conductor and the second wiring conductor.

This structure reduces the possibility of a short-circuit between the first wiring conductor and the second wiring conductor when the maximum potential difference between the first wiring conductor and the second wiring conductor is 10 V or more. Thus, the possibility of a short-circuit between the first wiring conductor and the second wiring conductor is reduced even when the first wiring conductor and the second wiring conductor have a potential difference that is likely to cause a short-circuit therebetween.

Preferably, application of a voltage to at least one of the first wiring conductor and the second wiring conductor may cause an electric field with a maximum strength of one millivolt per meter (MV/m) or more between the first wiring conductor and the second wiring conductor.

This structure reduces the possibility of a short-circuit between the first wiring conductor and the second wiring conductor when the maximum strength of the electric field between the first wiring conductor and the second wiring conductor is 1 MV/m or more. Thus, the possibility of a short-circuit between the first wiring conductor and the second wiring conductor is reduced even when the first wiring conductor and the second wiring conductor have a potential difference that is likely to cause a short-circuit therebetween.

It may be preferable that at least one of an end of the first wiring conductor and a portion of the second wiring conductor that faces the end of the first wiring conductor be covered with the protective layer.

According to this structure, the protective layer covers the end of the first wiring conductor and/or the portion of the second wiring conductor that faces the end of the first wiring conductor. As such, the protective layer covers portions where an electric discharge is likely to occur, thus more effectively reducing the possibility of a short-circuit between the first wiring conductor and the second wiring conductor.

It may be preferable that the first substrate have a third wiring conductor stacked on the first wiring conductor, and that at least one of an end of the third wiring conductor and a portion of the second wiring conductor that faces the end of the third wiring conductor be covered with the protective layer.

According to this structure, the protective layer covers the end of the third wiring conductor and/or the portion of the second wiring conductor that faces the end of the third wiring conductor. As such, the protective layer covers portions where an electric discharge is likely to occur, thus more effectively reducing the possibility of a short-circuit between the first wiring conductor and the second wiring conductor.

A second aspect of the invention provides a MEMS device including the piezoelectric device according to the first aspect.

Thus, the second aspect increases the reliability of the MEMS device.

A third aspect of the invention provides a liquid ejecting head including the piezoelectric device according to the first aspect.

Thus, the third aspect increases the reliability of the liquid ejecting head.

A fourth aspect of the invention provides a liquid ejecting apparatus including the liquid ejecting head according to the third aspect.

Thus, the fourth aspect increases the reliability of the liquid ejecting apparatus.

BRIEF DESCRIPTION OF THE DRAWINGS

The invention will be described with reference to the accompanying drawings, wherein like numbers reference like elements.

FIG. 4 is an enlarged cross-sectional view illustrating the main part of a recording head according to a second embodiment.

DESCRIPTION OF EXEMPLARY EMBODIMENTS

Embodiments of the invention are described below with reference to the accompanying drawings. Although the invention is described with reference to specific preferred embodiments including various limitations, it should be understood that the invention is not limited to these embodiments unless otherwise explicitly specified. An ink jet recoding head (hereinafter referred to simply as the recording head) 3 described in the embodiments is a liquid ejecting head that is a type of MEMS device. The recording head 3 is mounted on an ink jet printer (hereinafter referred to simply as the printer) 1 that is a type of liquid ejecting apparatus.

Figure 1:
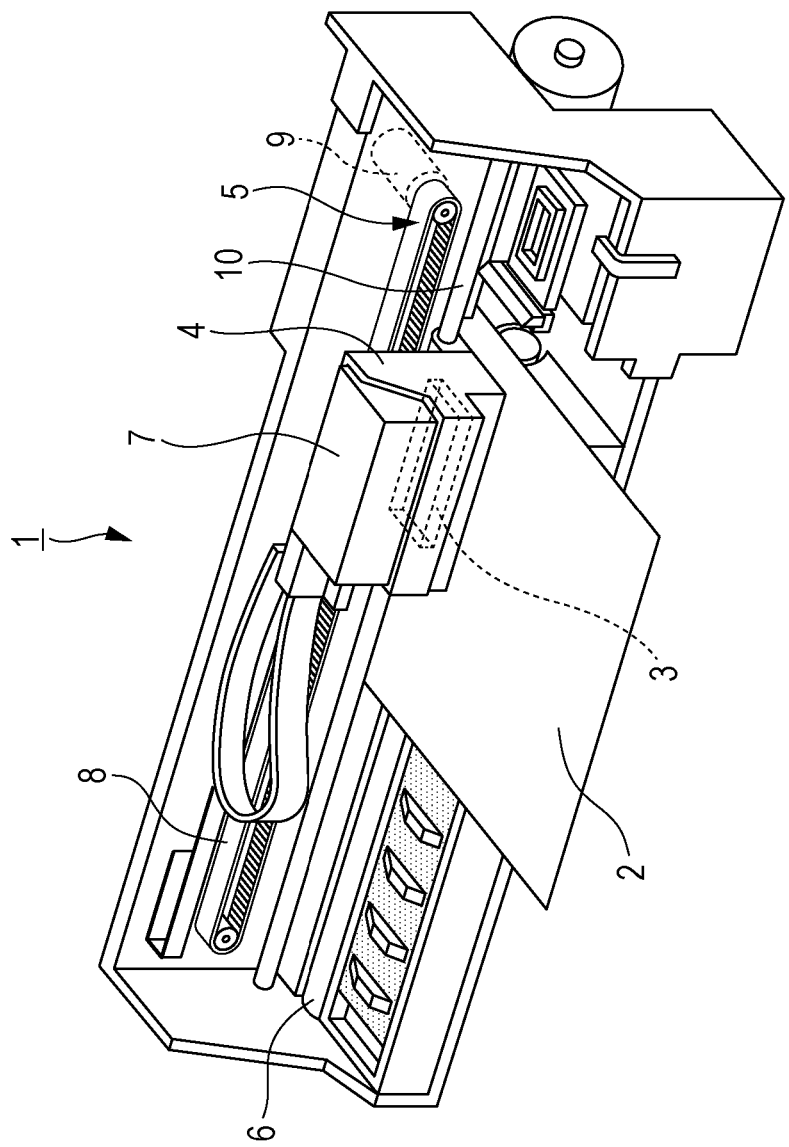
FIG. 1 is a perspective view illustrating the structure of a printer.

FIG. 1 is a perspective view of the printer 1. The printer 1 ejects ink (a type of liquid) onto a surface of a recording medium 2 (a type of object onto which droplets of liquid are to be ejected), such as a piece of recording paper, thereby recording an image on the recording medium 2. The printer 1 includes the following: the recording head 3; a carriage 4 on which the recording head 3 is mounted; a carriage moving mechanism 5 that moves the carriage 4 in a main scanning direction; and a transport mechanism 6 that transports the recording medium 2 in a the sub-scanning direction. The ink is stored in an ink cartridge 7 as a liquid supply source. The ink cartridge 7 is detachably attached to the recording head 3. Alternatively, an ink cartridge may be mounted on a printer body, and ink may be supplied from the ink cartridge to a recording head through an ink supply tube.

The carriage moving mechanism 5 includes a timing belt 8. The timing belt 8 is driven by a pulse motor 9, such as a direct current (DC) motor. When the pulse motor 9 is operated, the carriage 4 reciprocates in the main scanning direction (in the width direction of the recording medium 2) by being guided by a guide rod 10 that is installed across the printer 1. The position of the carriage 4 in the main scanning direction is detected by a linear encoder (not illustrated) that is a type of positional information detector. The linear encoder transmits, to a controller of the printer 1, a detection signal indicating the detected position, i.e., an encoder pulse (a type of positional information).

Figure 2:
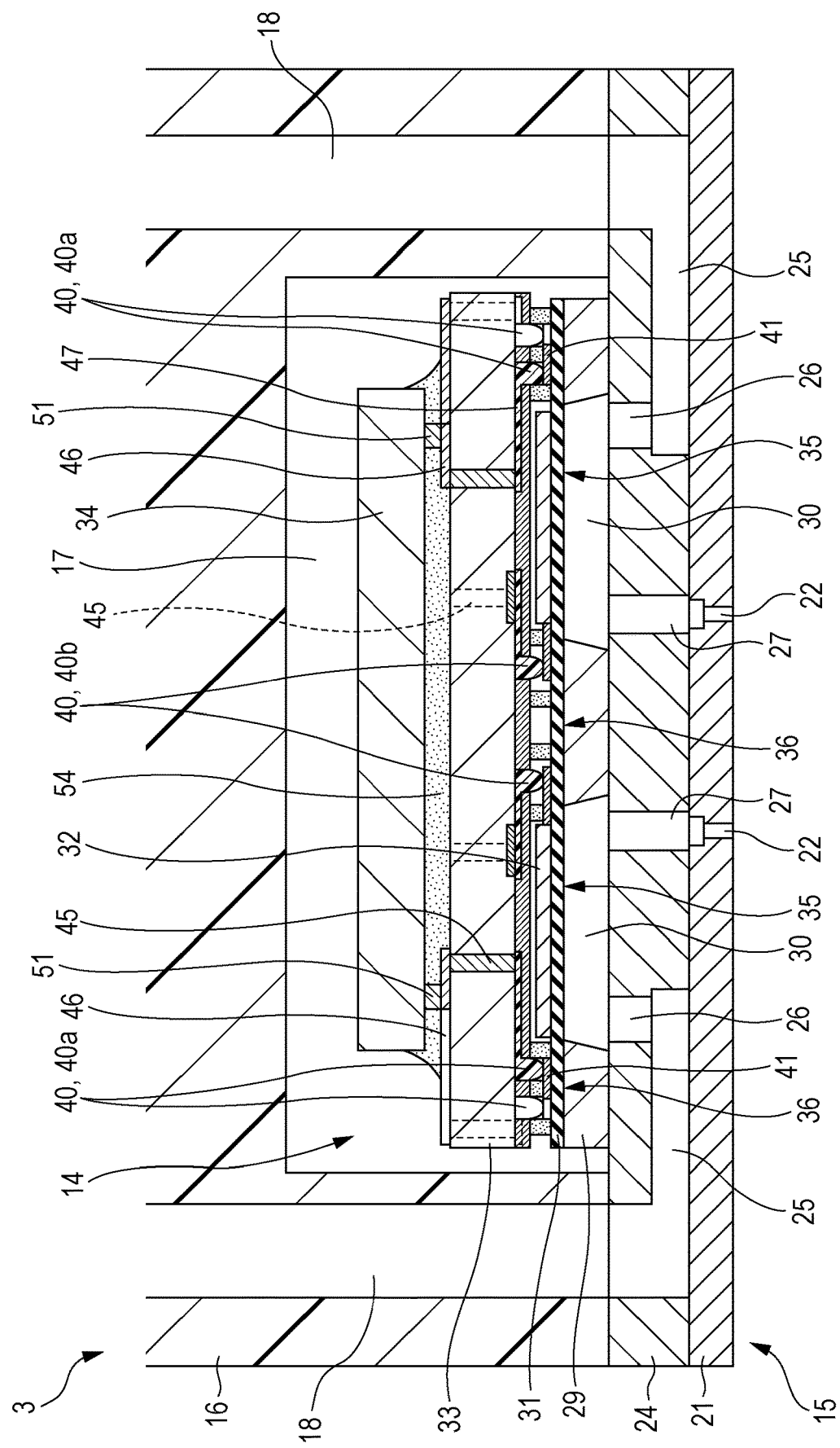
FIG. 2 is a cross-sectional view illustrating the structure of a recording head.
Figure 3:
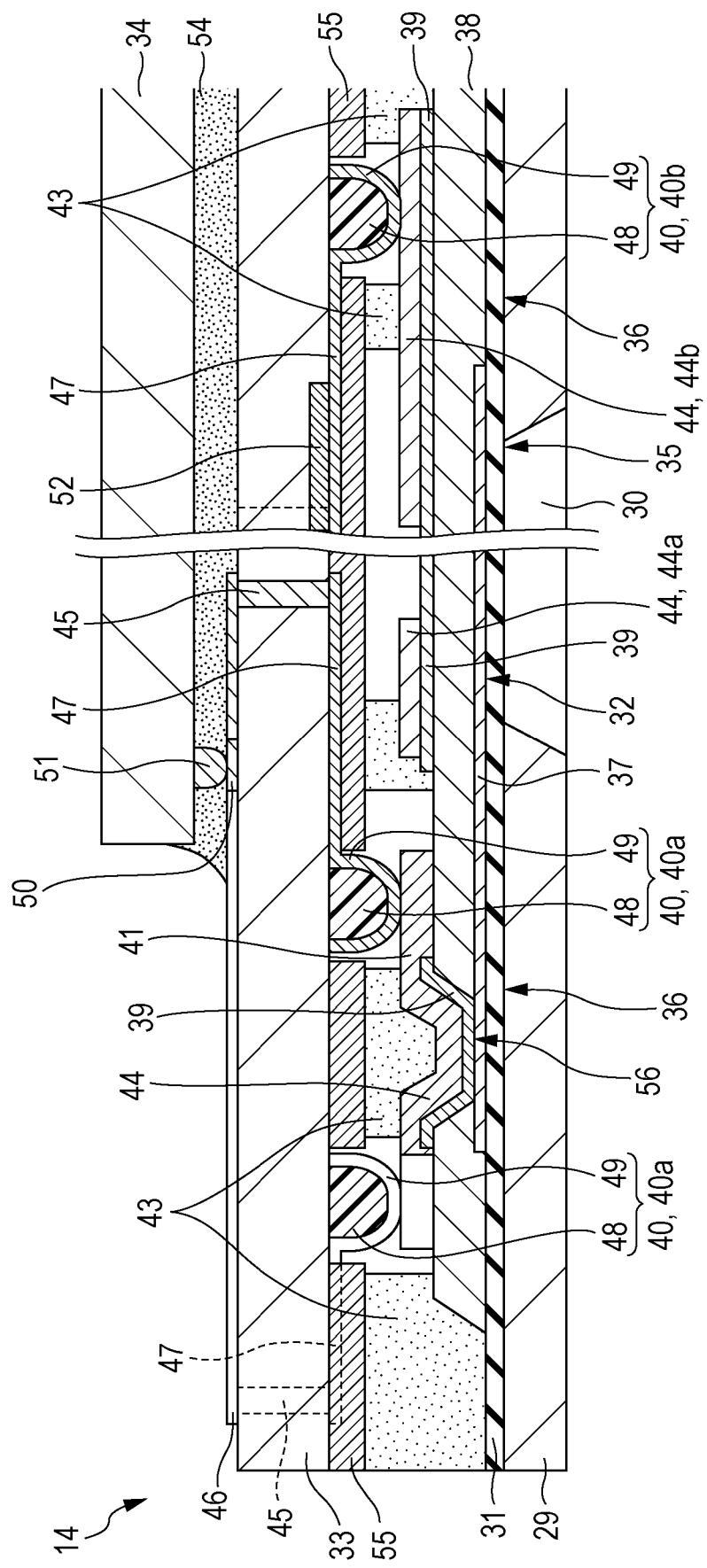
FIG. 3 is an enlarged cross-sectional view illustrating the main part of the recording head.

Next, the recording head 3 is described. FIG. 2 is a cross-sectional view of the recording head 3. FIG. 3 is an enlarged cross-sectional view of the main part of the recording head 3, i.e., an actuator unit 14 (corresponding to a piezoelectric device according to the invention). For the sake of brevity, a direction in which members of the recording head 3 are stacked is hereinafter referred to as a vertical direction. As illustrated in FIG. 2, according to the present embodiment, the recording head 3 is attached to a head case 16 with the actuator unit 14 stacked on a flow passage unit 15.

The head case 16 is box-shaped and is made of synthetic resin. The head case 16 has internal liquid-introducing passages 18 for supplying ink to pressure chambers 30. The liquid-introducing passages 18 and later-described common liquid chambers 25 form a space that stores ink shared among the pressure chambers 30. According to the present embodiment, the pressure chambers 30 are arranged in two rows, and two liquid-introducing passages 18 are formed accordingly. The bottom surface of the head case 16 is partially recessed to a predetermined height of the head case 16 to form a cuboid accommodation space 17. When the flow passage unit 15 is positioned relative to and joined to the bottom surface of the head case 16 as described later, the actuator unit 14 (including a pressure chamber forming substrate 29, a sealing substrate 33, and a drive IC 34) stacked on the flow passage unit 15 (specifically, a communication substrate 24) is accommodated within the accommodation space 17.

The flow passage unit 15 that is joined to the bottom surface of the head case 16 includes a communication substrate 24 and a nozzle substrate 21. The communication substrate 24 is a silicon substrate (e.g., a monocrystalline silicon substrate) and forms an upper portion of the flow passage unit 15. As illustrated in FIG. 2, the following are formed in the communication substrate 24 by anisotropic etching: the common liquid chambers 25 that communicate with the liquid-introducing passages 18 and that store ink shared among the pressure chambers 30; individual communication passages 26 each of which supplies ink to a corresponding one of the pressure chambers 30 from the liquid-introducing passages 18 through the common liquid chambers 25; and nozzle communication passages 27 that connect the pressure chambers 30 to nozzles 22. Each of the common liquid chambers 25 is a hollow space elongated in a nozzle row direction in which the nozzles 22 are arranged in rows. Since the pressure chambers 30 are arranged in two rows, two common liquid chambers 25 are formed accordingly.

The nozzle substrate 21 is a silicon substrate (e.g., a monocrystalline silicon substrate) and is joined to the bottom surface (opposite the surface to which the pressure chamber forming substrate 29 is joined) of the communication substrate 24. According to the present embodiment, the nozzle substrate 21 seals bottom openings of the common liquid chambers 25 to define the bottoms of the common liquid chambers 25. The nozzles 22 are formed in the nozzle substrate 21 and are arranged linearly (in rows). According to the present embodiment, since the pressure chambers 30 are arranged in two rows, the nozzles 22 are arranged in two rows accordingly. The rows of the nozzles 22 (hereinafter sometimes referred to as the nozzle rows) are arranged parallel to each other. In each of the nozzle rows, the nozzles 22 are arranged with a constant pitch corresponding to dot formation density, from one end of the nozzle row to the other end of the nozzle row, in the sub-scanning direction perpendicular to the main scanning direction. Alternatively, the nozzle substrate 21 may be joined to a portion of the communication substrate 24 that is located inward relative to the common liquid chambers 25, and a flexible compliant sheet or other suitable member may be used to seal the bottom openings of the common liquid chambers 25 to define the bottoms of the common liquid chambers 25.

As illustrated in FIGS. 2 and 3, according to the present embodiment, a pressure chamber forming substrate 29, a diaphragm 31, piezoelectric elements 32, a sealing substrate 33, and a drive IC 34 are stacked and united together to form the actuator unit 14. The actuator unit 14 is smaller than the accommodation space 17 and thus is accommodatable in the accommodation space 17.

The pressure chamber forming substrate 29 is a silicon substrate (e.g., a monocrystalline silicon substrate) and is joined to the top surface (opposite the surface to which the nozzle substrate 21 is joined) of the communication substrate 24. Portions of the pressure chamber forming substrate 29 are fully removed in the thickness direction of the pressure chamber forming substrate 29 by anisotropic etching to form spaces for the pressure chambers 30 that are arranged in rows in the nozzle row direction. The diaphragm 31 and the communication substrate 24 respectively define the top and bottom of the spaces formed in the pressure chamber forming substrate 29, thus forming the pressure chambers 30. Since there are two nozzle rows, the spaces, i.e., the pressure chambers 30 are arranged in two rows accordingly. Each of the pressure chambers 30 is a hollow space and has a longitudinal direction (a lateral direction in FIGS. 2 and 3) perpendicular to the nozzle row direction. Each of the pressure chambers 30 communicates at one longitudinal end with the corresponding individual communication passage 26 and at the other longitudinal end with the corresponding nozzle communication passage 27.

The diaphragm 31 is an elastic thin-film member and is stacked on the top surface (opposite the surface to which the communication substrate 24 is joined) of the pressure chamber forming substrate 29. The diaphragm 31 seals top openings of the pressure chambers 30 to define the tops of the pressure chambers 30. As such, the pressure chambers 30 are defined by the diaphragm 31. Portions of the diaphragm 31 corresponding to the pressure chambers 30 (specifically, the top openings of the pressure chambers 30) serve as displacement portions that are displaced in a direction away from or toward the nozzles 22 in accordance with deflective deformations of the piezoelectric elements 32. In other words, regions of the diaphragm 31 corresponding to the top openings of the pressure chambers 30 serve as drive regions 35 that are allowed to be deflected and deformed. In contrast, regions of the diaphragm 31 outside the top openings of the pressure chambers 30 serve as non-drive regions 36 that are not allowed to be deflected and deformed.

The diaphragm 31 includes, for example, an elastic layer that is formed on the top surface of the pressure chamber forming substrate 29 and that is made of silicon dioxide ($SiO_2$), and an electrically insulating layer that is formed on the elastic layer and that is made of zirconium oxide ($ZrO_2$). Each of the piezoelectric elements 32 is stacked on the insulating layer (the surface of the diaphragm 31 opposite the surface to which the pressure chamber forming substrate 29 is joined) at a location where the corresponding pressure chamber 30 is located, i.e., in the corresponding drive region 35. Thus, the diaphragm 31 and the piezoelectric elements 32 are located on the top side of the pressure chamber forming substrate 29. Since the pressure chambers 30 are arranged in two rows in the nozzle row direction, the piezoelectric elements 32 are arranged in two rows in the nozzle row direction accordingly. The pressure chamber forming substrate 29 and the diaphragm 31 that is stacked on the pressure chamber forming substrate 29, i.e., a substrate stack including the pressure chamber forming substrate 29 and the diaphragm 31 corresponds to a first substrate according to the invention.

According to the present embodiment, the piezoelectric elements 32 are so-called flexural-mode piezoelectric elements. As illustrated in FIG. 3, each of the piezoelectric elements 32 includes, for example, a bottom electrode layer 37, a piezoelectric layer 38, and a top electrode layer 39 (corresponding to a first wiring conductor according to the invention) that are sequentially stacked on the diaphragm 31. Specifically, the piezoelectric element 32 is formed by stacking the piezoelectric layer 38 on the bottom electrode layer 37 in the drive region 35 and by stacking the top electrode layer 39 on the piezoelectric layer 38. When an electric field is applied between the bottom electrode layer 37 and the top electrode layer 39 in accordance with the difference in potential between the bottom electrode layer 37 and the top electrode layer 39, the piezoelectric element 32 is deflected and deformed in a direction (an upward direction) away from the nozzle 22 or in a direction (a downward direction) toward the nozzle 22. The volume of the pressure chamber 30 changes in accordance with the deformation of the piezoelectric element 32, thus ejecting a droplet of ink from the nozzle 22 that communicates with the pressure chamber 30 through the nozzle communication passage 27. According to the present embodiment, the bottom electrode layer 37 is an individual electrode and is formed separately for each of the piezoelectric elements 32, whereas the top electrode layer 39 is a common electrode and is formed continuously over all the piezoelectric elements 32. Thus, the bottom electrode layer 37 and the piezoelectric layer 38 are formed separately for each of the pressure chambers 30. On the other hand, the top electrode layer 39 is formed continuously over all the pressure chambers 30. Alternatively, depending on design specifications of components, such as drive circuits or wiring conductors, the bottom electrode layer 37 may be formed as a common electrode, whereas the top electrode layer 39 may be formed as an individual electrode.

As illustrated in FIG. 3, according to the present embodiment, the bottom electrode layer 37 extends at both ends beyond the drive region 35 in the direction perpendicular to the nozzle row direction. Specifically, a first end of the bottom electrode layer 37 (on the outer side of the actuator unit 14) extends from the drive region 35 to the non-drive region 36 beyond a first end of the top electrode layer 39 (i.e., a first end of the piezoelectric element 32). In the vicinity of the first end of the bottom electrode layer 37 in the non-drive region 36, the piezoelectric layer 38 is removed to form a contact region 56 that exposes the bottom electrode layer 37 to the outside of the piezoelectric layer 38. In the contact region 56, the bottom electrode layer 37 is connected to an individual terminal 41. The individual terminal 41 is electrically connected to a later-described individual bump electrode 40a. Thus, an electrical signal (specifically, an individual voltage supplied separately to each of the piezoelectric elements 32) from the individual bump electrode 40a is applied to the bottom electrode layer 37 via the individual terminal 41. A second end of the bottom electrode layer 37 (on the inner side of the actuator unit 14) extends slightly beyond the drive region 35. The second end of the bottom electrode layer 37 defines the position of a second end of the piezoelectric element 32.

Further, according to the present embodiment, the piezoelectric layer 38 extends at both ends beyond the drive region 35 in the direction perpendicular to the nozzle row direction. Specifically, a first end of the piezoelectric layer 38 extends beyond the first end of the bottom electrode layer 37 and reaches a position beyond a region that faces the bump electrode 40. As already described, the region (i.e., the contact region 56) of the piezoelectric layer 38 in the vicinity of the first end of the bottom electrode layer 37 is removed. A second end of the piezoelectric layer 38 extends beyond the second end of the bottom electrode layer 37. According to the present embodiment, the piezoelectric layer 38 of one of the two rows (hereinafter referred to as the first row) of the piezoelectric elements 32 and the piezoelectric layer 38 of the other of the two rows (hereinafter referred to as the second row) of the piezoelectric elements 32 are connected together between the first row of the piezoelectric elements 32 and the second row of the piezoelectric elements 32. Thus, the piezoelectric layer 38 are shared between the first row of the piezoelectric elements 32 and the second row of the piezoelectric elements 32. Thus, the piezoelectric layer 38 extends across both the first row of the piezoelectric elements 32 and the second row of the piezoelectric elements 32. In the nozzle row direction, the piezoelectric layer 38 extends at both ends beyond a region where the piezoelectric elements 32 are arranged. The piezoelectric layer 38 is removed in each of the non-drive regions 36 between the piezoelectric elements 32 to form openings (not illustrated). The openings divide the piezoelectric layer 38 into individual pieces for each of the piezoelectric elements 32.

Further, according to the present embodiment, the top electrode layer 39 extends at both ends beyond the drive region 35 in the direction perpendicular to the nozzle row direction. Specifically, a first end of the top electrode layer 39 extends slightly beyond the drive region 35. The first end of the top electrode layer 39 defines the position of a first end of the piezoelectric element 32. On the other hand, a second end of the top electrode layer 39 extends beyond the second end of the bottom electrode layer 37 (i.e., the second end of the piezoelectric element 32) and reaches a position corresponding to a later-described common bump electrode 40b in the non-drive region 36. The common bump electrode 40b is electrically connected to the top electrode layer 39 near the second end of the top electrode layer 39. Thus, an electrical signal (specifically, a common voltage that is applied equally to all the piezoelectric elements 32) from the common bump electrode 40b is applied to the top electrode layer 39 that is located in a region that serves as the piezoelectric element 32. In the contact region 56, the top electrode layer 39 is formed separately for each of the piezoelectric elements 32 because the bottom electrode layer 37 is formed separately for each of the piezoelectric elements 32. The top electrode layer 39 formed in the contact region 56 is part of the individual terminal 41 and covers the bottom electrode layer 37 that is exposed to the outside of the piezoelectric layer 38. The top electrode layer 39 formed in the contact region 56 is electrically isolated from the top electrode layer 39 that is located in the region that serves as the piezoelectric element 32.

According to the present embodiment, a metal layer 44 (corresponding to a third wiring conductor according to the invention) is stacked on the top electrode layer 39. Specifically, the metal layer 44 is located corresponding to the contact region 56 and is also located corresponding to both ends of the piezoelectric element 32 in the longitudinal direction of the piezoelectric element 32 (in the direction perpendicular to the nozzle row direction). The metal layer 44 that is located corresponding to the contact region 56 is part of the individual terminal 41 and is formed separately for each of the piezoelectric elements 32. At the location corresponding to the contact region 56, the metal layer 44 extends from one end of the top electrode layer 39 to a position beyond the other end of the top electrode layer 39. Thus, the metal layer 44 has an end that is elongated beyond the top electrode layer 39 and that overlaps the piezoelectric layer 38. The individual bump electrode 40a abuts against the elongated end of the metal layer 44. According to the present embodiment, the individual bump electrodes 40a are arranged in two rows in a zigzag manner in the nozzle row direction (i.e., arranged alternately in the direction perpendicular to the nozzle row direction). Accordingly, the metal layer 44 having the end that is elongated from the contact region 56 in a first direction (away from the piezoelectric element 32) and the metal layer 44 having the end that is elongated from the contact region 56 in a second direction (toward the piezoelectric element 32) are alternately arranged in the nozzle row direction. The metal layer 44 that is located corresponding to both ends of the piezoelectric element 32 in the longitudinal direction lies astride the boundary between the drive region 35 and the non-drive region 36. This reduces excessive deformation of the ends of the piezoelectric element 32, thus protecting the piezoelectric layer 38 and other elements from being damaged at the boundary between the drive region 35 and the non-drive region 36. The metal layer 44 that is located corresponding to the piezoelectric element 32 is stacked on the top electrode layer 39 in the region that serves as the piezoelectric element 32 and thus has the same potential as the top electrode layer 39. Thus, when a common voltage is applied to the top electrode layer 39 in the region that serves as the piezoelectric element 32, the common voltage is also applied to the metal layer 44 that is located corresponding to the piezoelectric element 32. The metal layer 44 that is located corresponding to the piezoelectric element 32 has a first metal layer 44a and a second metal layer 44b. The first metal layer 44a is located corresponding to a first end of the piezoelectric element 32. The second metal layer 44b is located corresponding to a second end of the piezoelectric element 32. Like the second end of the top electrode layer 39, the second metal layer 44b is elongated to the position corresponding to the common bump electrode 40b. The common bump electrode 40b abuts against the elongated portion of the second metal layer 44b.

The bottom electrode layer 37 and the top electrode layer 39 may be made of metal such as iridium (Ir), platinum (Pt), titanium (Ti), tungsten (W), nickel (Ni), palladium (Pd), or gold (Au), an alloy of these metals, or an alloy such as LaNiO$_3$. The piezoelectric layer 38 may be made of a ferroelectric, piezoelectric material such as lead zirconate titanate (PZT), or a relaxor ferroelectric material that is a ferroelectric, piezoelectric material doped with a metal such as niobium (Nb), nickel (Ni), magnesium (Mg), bismuth (Bi), or yttrium (Y). Further, a lead-free material such as barium titanate may be used as a material for the piezoelectric layer 38. The metal layer 44 may be an adhesion layer coated with gold (Au), copper (Cu), or other suitable material, and the adhesion layer may be made of titanium (Ti), nickel (Ni), chromium (Cr), tungsten (W), or an alloy of these materials.

The sealing substrate 33 (corresponding to a second substrate according to the invention) is a flat silicon substrate. As illustrated in FIGS. 2 and 3, an electrically insulating adhesive 43 is interposed between the sealing substrate 33 and the diaphragm 31 such that the sealing substrate 33 is spaced from the piezoelectric elements 32. According to the present embodiment, the sealing substrate 33 is a monocrystalline silicon substrate having (110) crystal orientation surfaces (top and bottom surfaces). According the present embodiment, the adhesive 43 is located on both sides of each of the bump electrodes 40 in the direction perpendicular to the nozzle row direction. The outermost portion of the adhesive 43 is located around the perimeter of the actuator unit 14. Thus, the piezoelectric elements 32 are held in a sealed space enclosed by the pressure chamber forming substrate 29 (specifically, the diaphragm 31), the sealing substrate 33, and the adhesive 43. Preferably, the adhesive 43 may be photosensitive. For example, the adhesive 43 may be made preferably of a resin material containing mainly an epoxy resin, a phenolic resin, a polyimide resin, a silicone resin, a styrene resin, etc. The adhesive 43 adheres (joins) the pressure chamber forming substrate 29 having the stacked elements including the diaphragm 31 to the sealing substrate 33 such that there is a space between the pressure chamber forming substrate 29 and the sealing substrate 33.

According to the present embodiment, bump electrodes 40 are formed on the bottom surface (the surface facing toward the pressure chamber forming substrate 29) of the sealing substrate 33. The bump electrodes 40 output drive signals, received from the drive IC 34, to the piezoelectric elements 32. The bump electrodes 40 include the individual bump electrode 40a and a common bump electrode 40b. The individual bump electrode 40a faces the non-drive region 36 outside the first end of the piezoelectric element 32. The common bump electrode 40b faces the non-drive region 36 outside the second end of the piezoelectric element 32. The individual bump electrode 40a supplies the individual voltage to the bottom electrode layer 37. According to the present embodiment, the individual bump electrodes 40a are arranged two rows in a zigzag manner in the nozzle row direction. Specifically, the individual bump electrodes 40a of one row (hereinafter sometimes referred to as the first individual bump electrode 40a) that are located farther from the piezoelectric elements 32 and the individual bump electrodes 40a of the other row (hereinafter sometimes referred to as the second individual bump electrode 40a) that are located closer to the piezoelectric elements 32 are alternately arranged in the nozzle row direction. As such, two rows of the individual bump electrodes 40a are provided for each row of the piezoelectric elements 32. The common bump electrode 40b supplies the common voltage to the top electrode layer 39. One row of the common bump electrodes 40b is provided for each row of the piezoelectric elements 32.

The bump electrodes 40 are elastic and project from the surface of the sealing substrate 33 toward the diaphragm 31. Specifically, as illustrated in FIG. 3, each of the bump electrodes 40 includes an elastic internal resin 48 and a conductive layer 49 that at least partially covers the surface of the internal resin 48. The conductive layer 49 is part of a bottom wiring conductor 47. The internal resin 48 protrudes from the surface of the sealing substrate 33 and is elongated in the nozzle row direction. The conductive layers 49 are arranged in the nozzle row direction. The conductive layer 49 of each of the first individual bump electrodes 40a and the second individual bump electrodes 40a is formed separately for the corresponding individual terminal 41. In contrast, the conductive layer 49 of the common bump electrode 40b is formed separately for each of groups of a predetermined number of the piezoelectric elements 32. The common bump electrode 40b may be formed separately for each of the piezoelectric elements 32. Each of the conductive layers 49 covers the surface of the internal resin 48 and extends toward or away from the piezoelectric element 32, thus forming the bottom wiring conductor 47. Specifically, the conductive layer 49 of the first individual bump electrode 40a extends to an edge of the sealing substrate 33 and forms the bottom wiring conductor 47 that is located on the perimeter of the sealing substrate 33. The conductive layer 49 of the second individual bump electrode 40a extends to a location inside the first metal layer 44a and forms the bottom wiring conductor 47 that partially faces the piezoelectric element 32. Thus, the bottom wiring conductor 47 faces and is separated from the first metal layer 44a or the top electrode layer 39 in the region that serves as the piezoelectric element 32. The conductive layer 49 that is elongated from the bump electrode 40, i.e., the bottom wiring conductor 47 corresponds to a second wiring conductor according to the invention. The bottom wiring conductor 47 connected to the individual bump electrode 40a is connected to a later-described through wiring conductor 45 at a location displaced from the bump electrode 40.

The conductive layer 49 of the common bump electrode 40b extends to a location inside the second metal layer 44b and forms the bottom wiring conductor 47 that partially faces the piezoelectric element 32. According to the present embodiment, the bottom wiring conductor 47 of the common bump electrode 40b is connected to a buried wiring conductor 52 at a location displaced from the common bump electrode 40b. The buried wiring conductor 52 is made of metal or other suitable material and is buried in the bottom surface of the sealing substrate 33. The buried wiring conductor 52 overlaps the bottom wiring conductor 47 of the common bump electrode 40b. Specifically, the buried wiring conductor 52 is covered with the bottom wiring conductor 47 of the common bump electrode 40b. The buried wiring conductor 52, and the bottom wiring conductor 47 of the common bump electrode 40b extend to an edge of the sealing substrate 33 in the nozzle row direction and are connected to the through wiring conductor 45. The internal resin 48 may be made of an elastic resin, such as a polyimide resin, a phenolic resin, or an epoxy resin. The conductive layer 49 of the bump electrode 40 is made of metal, such as gold (Au), titanium (Ti), aluminum (Al), chromium (Cr), nickel (Ni), copper (Cu), or an alloy of these metals.

The through wiring conductor 45 connects the top and bottom surfaces of the sealing substrate 33 and is a conductor, such as a metal, formed in a through hole that penetrates the sealing substrate 33 in its thickness direction. The through wiring conductor 45 that is connected to the individual bump electrode 40a has a bottom end that is exposed to the bottom surface of the sealing substrate 33 and that is covered with the corresponding bottom wiring conductor 47. On the other hand, the through wiring conductor 45 that is connected to the individual bump electrode 40a has a top end that is exposed to the top surface of the sealing substrate 33 and that is covered with a corresponding top wiring conductor 46. The top wiring conductor 46 extends from the through wiring conductor 45 to an IC connection terminal 50 that is connected to an IC terminal 51 of the drive IC 34, thus connecting the through wiring conductor 45 to the IC connection terminal 50. As such, the top wiring conductor 46, the through wiring conductor 45, and the bottom wiring conductor 47 are connected together to form a continuous wiring conductor that connects the IC connection terminal 50 to the individual bump electrode 40a. Thus, the electrical signal (i.e., the individual voltage) supplied from the IC connection terminal 50 is applied to the bottom electrode layer 37 via the continuous wiring conductor of the sealing substrate 33. According to the present embodiment, the electrical signal applied to the bottom electrode layer 37 has an oscillatory potential (voltage) waveform and has the maximum potential (the maximum voltage) of, for example, about 25 volts (V). The through wiring conductor 45 that is connected to the common bump electrode 40b has a top end that is exposed to the top surface of the sealing substrate 33 and that is covered with a non-illustrated top wiring conductor. The non-illustrated top wiring conductor is connected to a non-illustrated terminal that supplies an electrical signal (i.e., the common voltage). Thus, the electrical signal supplied from the non-illustrated terminal is applied to the top electrode layer 39 on the piezoelectric element 32 via a continuous wiring conductor of the sealing substrate 33 that is formed by the non-illustrated top wiring conductor, the through wiring conductor 45, the bottom wiring conductor 47, and the common bump electrode 40b. According to the present embodiment, the electrical signal applied to the top electrode layer 39 has a constant potential (a constant voltage) of, for example, 5 V. Alternatively, no voltage may be applied to the top electrode layer 39, and the top electrode layer 39 may be grounded.

According to the present embodiment, the bottom surface of the bottom wiring conductor 47 and the top surface of the first metal layer 44a are separated from each other by a distance of about 20 micrometers, and the bottom surface of the bottom wiring conductor 47 and the top surface of the top electrode layer 39 on the piezoelectric element 32 are separated from each other by a distance of about 21 micrometers. When the piezoelectric element 32 is driven (i.e., when a voltage is applied between the bottom wiring conductor 47 and the top electrode layer 39 on the piezoelectric element 32), the bottom wiring conductor 47 connected to the second individual bump electrode 40a has the maximum potential of about 25 V, and the first metal layer 44a and the top electrode layer 39 on the piezoelectric element 32, each of which faces the second individual bump electrode 40a, has a potential of about 5 V. Thus, the maximum potential difference between the bottom surface of the bottom wiring conductor 47 and each of the first metal layer 44a and the top electrode layer 39 on the piezoelectric element 32 is about 20 V. Accordingly, the maximum strength of the electric field caused between the bottom surface of the bottom wiring conductor 47 and the top surface of the first metal layer 44a is about 1.25 millivolts per meter (MV/m). In general, an electric field strength that causes an electric discharge in air is about 3 MV/m, and the maximum potential difference between both electrodes at this time is about 63 V. The space between the bottom surface of the bottom wiring conductor 47 and the top surface of the first metal layer 44a, i.e., the space defined by the diaphragm 31, the sealing substrate 33, and the adhesive 43 is likely to be filled with not only air, but also some of the ingredients (water and solvent) of ink that are vaporized and pass through the diaphragm 31. Such environments tend to cause an electric discharge at lower electric field strengths. For example, in air saturated with water vapor, an electric field strength that causes an electric discharge is about 1 MV/m or less, and the maximum potential difference between both electrodes at this time is about 20 V or less. Further, since the first metal layer 44a partially overlaps the drive region 35, the separation distance between the electrodes may change due to various factors including displacement of the drive region 35 and external force application. The separation distance change may cause an electric discharge even when the maximum potential difference between the electrodes is about 10 V. For this reason, an electric discharge is likely to occur at the electric field strength according to the present embodiment. Specifically, a short-circuit is likely to occur between the bottom wiring conductor 47 connected to the second individual bump electrode 40a and the metal layer 44. According to the present embodiment, to reduce the possibility of such a short-circuit, the bottom surface of the sealing substrate 33 is provided with the electrically insulating protective layer 55.

Specifically, according to the present embodiment, the protective layer 55 is formed almost all over the bottom surface of the sealing substrate 33 except regions where the bump electrodes 40 (specifically, the internal resin 48) are formed. Thus, the protective layer 55 covers almost all over the bottom wiring conductors 47 outside the bump electrodes 40. The adhesive 43 is adhered to the surface of the protective layer 55. The protective layer 55 may be preferably made of an oxide, a nitride, or a resin. Examples of an oxide for the protective layer 55 include a silicon oxide ($SiO_x$) layer and a zirconium oxide ($ZrO_2$). Examples of a nitride for the protective layer 55 include a silicon nitride (SiN$_x$) layer and an aluminium nitride (AlN). When the protective layer 55 is made of such an oxide or nitride, the oxide or nitride is deposited by a layer deposition technique, such as sputtering, commonly used in the field of semiconductors. After the deposition, procedures including photoresist application, exposure, developing, and etching are performed so that the protective layer 55 is formed at predetermined locations. Examples of resin for the protective layer 55 contain mainly an epoxy resin, a phenolic resin, a polyimide resin, a silicone resin, a styrene resin, etc. Such resin is applied to the bottom surface of the sealing substrate 33 by using a spin coater or other suitable tool and then is exposed to heat or light (e.g., ultraviolet light) so that a resin layer is formed. After the resin layer is formed, procedures including exposure and developing is performed so that the protective layer 55 is formed at predetermined locations. Using an oxide, a nitride, or a resin as a material for the protective layer 55 facilitates forming the protective layer 55. It is preferable that the protective layer 55 be made of the same type of resin as the adhesive 43. This allows the protective layer 55 and the adhesive 43 to be more tightly adhered together, thus increasing the strength of adhesion (the strength of a joint) between the first substrate and the second substrate. The term "the same type of resin" means not only that the protective layer 55 and the adhesive 43 are made of resins having identical composition, but also means that the protective layer 55 and the adhesive 43 are made of resins having the same main ingredient, but different additives.

As described above, the bottom wiring conductor 47, in particular, the bottom wiring conductor 47 that faces the first metal layer 44a and the top electrode layer 39 on the piezoelectric element 32 and that causes a potential difference with respect to the layers 44a and 39 is covered with the protective layer 55. Thus, the protective layer 55 reduces the possibility of a short-circuit between the bottom wiring conductor 47 and the metal layer 44a or the top electrode layer 39. Specifically, the protective layer 55 serves as an energy barrier against the flow of electrons, thus making it less likely that an electric discharge occurs between the bottom wiring conductor 47 and the metal layer 44a or the top electrode layer 39. This allows a reduction in the separation distance between the bottom wiring conductor 47 and the metal layer 44a (the piezoelectric element 32 to curb an increase in the size of the actuator unit 14, i.e., to curb an increase in the size of the recording head 3. Further, this eliminates the need to arrange the bottom wiring conductor 47 such that the bottom wiring conductor 47 faces neither the first metal layer 44a nor the top electrode layer 39 on the piezoelectric element 32. In other words, this allows the bottom wiring conductor 47 to face the first metal layer 44a and the top electrode layer 39 on the piezoelectric element 32, thus increasing design flexibility. The design flexibility makes it possible to curb an increase in the size of the actuator unit 14, i.e., to curb an increase in the size of the recording head 3. Moreover, since the possibility of a short-circuit between the bottom wiring conductor 47 and the metal layer 44a or the top electrode layer 39 is reduced, the reliability of the actuator unit 14 is increased so that the reliability of the recording head 3 is increased. Accordingly, the reliability of the printer 1 is increased. In addition, according to the present embodiment, the adhesive 43 covers the first end of the first metal layer 44a and the first end of the top electrode layer 39 on the piezoelectric element 32, thus making it much less likely that an electric discharge occurs between the bottom wiring conductor 47 and the first end of the first metal layer 44a or the first end of the top electrode layer 39 on the piezoelectric element 32.

The drive IC 34 is joined to the top surface of the sealing substrate 33. The drive IC 34 is an IC chip for driving the piezoelectric elements 32. According to the present embodiment, the drive IC 34 is joined to the top surface of the sealing substrate 33 via an adhesive 54, such as an anisotropic conductive film (ACF). As illustrated in FIG. 2 and FIG. 3, the IC terminals 51 are formed on the bottom surface (the surface facing toward the sealing substrate 33) of the drive IC 34 and are connected to the IC connection terminals 50. The IC terminals 51 that correspond to the individual terminals 41 are arranged in rows in the nozzle row direction. According to the present embodiment, since the piezoelectric element 32 are arranged in two rows, the IC terminals 51 are arranged in two rows accordingly. In each row of the IC terminals 51, the IC terminals 51 are arranged with a pitch (i.e., a distance between the centers of adjacent ones of the IC terminals 51) smaller than a pitch with which the piezoelectric element 32 are arranged.

The separation distance, the potential difference, and the strength of the electric field caused between the bottom surface of the bottom wiring conductor 47 and the first metal layer 44a (the top electrode layer 39 on the piezoelectric element 32) described in the first embodiment are merely illustrative and can vary. In particular, the invention is preferably applicable to cases where the maximum potential difference between the bottom surface of the bottom wiring conductor 47 and the first metal layer 44a or the top electrode layer 39 on the piezoelectric element 32 is at least about 20 V or more, or cases where the maximum strength of the electric field caused between the bottom surface of the bottom wiring conductor 47 and the first metal layer 44a or the top electrode layer 39 on the piezoelectric element 32 is at least about 1 MV/m or more. The invention is more preferably applicable to cases where the maximum potential difference between the bottom surface of the bottom wiring conductor 47 and the first metal layer 44a or the top electrode layer 39 on the piezoelectric element 32 is about 110 V or more. Thus, when there is a possibility that a short-circuit occurs between the bottom surface of the bottom wiring conductor 47 and the first metal layer 44a (the top electrode layer 39 on the piezoelectric element 32), the invention reduces the possibility of a short-circuit.

According to the first embodiment, the protective layer 55 is formed almost all over the bottom surface of the sealing substrate 33 except regions where the bump electrodes 40 are formed, but this structure is merely illustrative. For example, according to a second embodiment illustrated in FIG. 4, a protective layer 55 partially covers the bottom wiring conductor 47 on the bottom surface of the sealing substrate 33.

Specifically, as illustrated in FIG. 4, according to the second embodiment, in the direction perpendicular to the nozzle row direction, the protective layer 55 extends from a position on the bottom surface of the sealing substrate 33 that is located beyond the first end of the piezoelectric element 32 (i.e., the first end of the top electrode layer 39 on the piezoelectric element 32), to a position that allows the protective layer 55 to cover an end (the end closer to the common bump electrode 40b) of the bottom wiring conductor 47 that is located beyond the second end of the first metal layer 44a. Thus, the protective layer 55 covers the bottom wiring conductor 47 in regions where the bottom wiring conductor 47 faces the top electrode layer 39 on the piezoelectric element 32 and the first metal layer 44a. In the other regions, there is no protective layer 55 so that the bottom wiring conductor 47 is exposed. As described above, the wiring conductor of the sealing substrate 33 that causes a potential difference with respect to the wiring conductor of the pressure chamber forming substrate 29, i.e., the bottom wiring conductor 47 that is connected to the individual bump electrode 40a and that faces the first metal layer 44a and the top electrode layer 39 on the piezoelectric element 32 is covered with the protective layer 55. Thus, the protective layer 55 reduces the possibility of a short-circuit between the bottom wiring conductor 47 and the first metal layer 44a or the top electrode layer 39 on the piezoelectric element 32. In particular, the protective layer 55 covers the bottom wiring conductor 47 that faces the first end of the top electrode layer 39 on the piezoelectric element 32 where an electric discharge is likely to occur, thus making it much less likely that a short-circuit occurs between the top electrode layer 39 and the bottom wiring conductor 47. Further, the protective layer 55 covers the bottom wiring conductor 47 that faces the second end of the first metal layer 44a where an electric discharge is likely to occur, thus making it much less likely that a short-circuit occurs between the bottom wiring conductor 47 and the metal layer 44a. Since the protective layer 55 is not formed in the other regions, the material for the protective layer 55 can be selected from a wide range of options. Specifically, since the adhesive 43 that is provided in the regions where the protective layer 55 is not formed ensures enough adhesion strength, there is no need that the protective layer 55 is made of a material that has good adhesion with the adhesive 43. The other structures of the second embodiment are the same as those of the first embodiment and therefore are not described here.

According to the first and second embodiments, the protective layer 55 is formed at the sealing substrate 33, but this is merely illustrative. The protective layer 55 may be formed at the pressure chamber forming substrate 29. For example, the protective layer 55 may cover a region from the first end of the top electrode layer 39 on the piezoelectric element 32 to the second end of the first metal layer 44a. Alternatively, the protective layer 55 may be formed at both the sealing substrate 33 and the pressure chamber forming substrate 29.

According to the embodiments, the drive IC 34 is placed on the sealing substrate 33, but this is merely illustrative. For example, a circuit equivalent to the drive IC 34 may be integrated on the sealing substrate 33. According to the embodiments, the driven piezoelectric elements 32 displace the drive regions 35 so that the nozzle 22 ejects ink that is a type of liquid, but this is merely illustrative. The invention is applicable to any MEMS device that are structured such that a wiring conductor on a first substrate faces a wiring conductor on a second substrate. For example, the invention may be applied to sensors for detecting pressure changes, vibrations, or displacements in drive regions.

According to the embodiments, the ink jet printer 1 having the ink jet recording head 3 that is a type of liquid ejecting head is taken as an example to describe a liquid ejecting apparatus that embodies the invention, but this is merely illustrative. The invention is applicable to liquid ejecting apparatuses having other types of liquid ejecting heads. For example, the invention may be applied to liquid ejecting apparatuses having any of the following heads: coloring material ejecting heads used to manufacture color filters for displays such as liquid-crystal displays; electrode material ejecting heads used to form electrodes for displays such as organic electroluminescence (EL) displays and field emission displays (FEDs); and bio-organic material ejecting heads used to manufacture biochips (biochemical elements). Coloring material ejecting heads used in display manufacturing apparatuses eject red (R), green (G), and blue (B) coloring material solutions as a type of liquid. Electrode material ejecting heads used in electrode-forming apparatuses eject a liquid electrode material as a type of liquid. Bio-organic material ejecting heads used in chip manufacturing apparatuses eject a bio-organic material solution as a type of liquid.

What is claimed is:

1. A piezoelectric device comprising:
    a first substrate including a piezoelectric layer and a first wiring conductor that is at least partially stacked on the piezoelectric layer; and
    a second substrate including a second wiring conductor that faces the first wiring conductor and to which an electrical signal different from an electrical signal that is applied to the first wiring conductor is applied, wherein
    at least one of the first wiring conductor and the second wiring conductor is at least partially covered with an electrically insulating protective layer, the electrically insulating protective layer being in contact with the second wiring conductor and disposed between the first substrate and the second substrate to prevent a short-circuit between the first wiring conductor and the second wiring conductor, and
    an insulting adhesive layer between at least a portion of the electrically insulating protective layer and the piezoelectric layer.

2. The piezoelectric device according to claim 1, wherein the protective layer is made of an oxide, a nitride, or a resin.

3. The piezoelectric device according to claim 2, wherein the first substrate and the second substrate are joined together by an adhesive, and
    the adhesive and the protective layer are made of an identical type of resin.

4. The piezoelectric device according to claim 1, wherein application of a voltage to at least one of the first wiring conductor and the second wiring conductor causes a maximum potential difference of ten volts or more between the first wiring conductor and the second wiring conductor.

5. The piezoelectric device according to claim 1, wherein application of a voltage to at least one of the first wiring conductor and the second wiring conductor causes an electric field with a maximum strength of one millivolt per meter or more between the first wiring conductor and the second wiring conductor.

6. The piezoelectric device according to claim 1, wherein at least one of an end of the first wiring conductor and a portion of the second wiring conductor that faces the end of the first wiring conductor is covered with the protective layer.

7. The piezoelectric device according to claim 1, wherein the first substrate further includes a third wiring conductor that is stacked on the first wiring conductor, and
    at least one of an end of the third wiring conductor and a portion of the second wiring conductor that faces the end of the third wiring conductor is covered with the protective layer.

8. A MEMS device comprising:
    the piezoelectric device according to claim 1.

9. A liquid ejecting head comprising:
    the piezoelectric device according to claim 1.

10. A liquid ejecting apparatus comprising:
    the liquid ejecting head according to claim 9.

11. A MEMS device comprising:
the piezoelectric device according to claim 2.
12. A MEMS device comprising:
the piezoelectric device according to claim 3.
13. A MEMS device comprising:
the piezoelectric device according to claim 4.
14. A MEMS device comprising:
the piezoelectric device according to claim 5.
15. A MEMS device comprising:
the piezoelectric device according to claim 6.
16. A MEMS device comprising:
the piezoelectric device according to claim 7.
17. A liquid ejecting head comprising:
the piezoelectric device according to claim 2.
18. A liquid ejecting head comprising:
the piezoelectric device according to claim 3.
19. A liquid ejecting head comprising:
the piezoelectric device according to claim 4.
20. A liquid ejecting head comprising:
the piezoelectric device according to claim 5.

* * * * *